United States Patent [19]

Kurz et al.

[11] 4,330,730
[45] May 18, 1982

[54] WOUND PIEZOELECTRIC POLYMER FLEXURE DEVICES

[75] Inventors: Warren W. Kurz; J. Kelly Lee, both of Rochester, N.Y.

[73] Assignee: Eastman Kodak Company, Rochester, N.Y.

[21] Appl. No.: 134,404

[22] Filed: Mar. 27, 1980

[51] Int. Cl.³ .......................................... H01L 41/08
[52] U.S. Cl. ................................... 310/331; 310/330; 310/332; 310/800
[58] Field of Search .............................. 310/330–332, 310/800

[56] References Cited

U.S. PATENT DOCUMENTS 3,943,614 3/1976 Yoshikawa et al. ................ 310/800

OTHER PUBLICATIONS

*Electromotional Device Using PVF₂ Multilayer Bimorph*, by Toda & Osaka, Transactions of the IECE of Japan, vol. 61, No. 7, Jul. 1978, pp. 507–512.

*Primary Examiner*—Mark O. Budd
*Attorney, Agent, or Firm*—Thomas H. Close

[57] ABSTRACT

Disclosed herein is a piezoelectric flexure device in which the piezoelectric element(s) thereof comprises a flexible piezoelectric layer (e.g. a suitably polarized polymeric film) which is tightly wound about an axis to produce a plurality of substantially concentric layers of piezoelectric material. Positioned between adjacent piezoelectric layers are conductive layers which function as electrodes for either applying an electric field across the piezoelectric layers to cause the device to flex, or for detecting the electrical potential produced in the device as a result of subjecting the piezoelectric element to a mechanical stress. Owing to the wound nature of the piezoelectric element, the device is relatively simple to manufacture and the conductive layers are less apt to crack or break during the manufacturing process. Also disclosed herein are techniques for producing such piezoelectric flexure devices.

12 Claims, 6 Drawing Figures

WOUND PIEZOELECTRIC POLYMER FLEXURE DEVICES

BACKGROUND OF THE INVENTION

This invention relates to improvements in piezoelectric flexure devices, as well as to improvements in methods of manufacturing such devices.

A piezoelectric flexure device is a device which, owing to its piezoelectric properties, either bends in the presence of an applied electric field or, alternatively, generates a voltage in response to being mechanically bent. In its simplest form, such a device is a bilaminar structure comprising a pair of bonded strips, at least one of which exhibits piezoelectric properties. In the presence of an applied electric field, the piezoelectric strip expands or contracts and, because the strip to which it is bonded resists such expansion or contraction, the device flexes or bends.

A piezoelectric flexure device in which only one of the two bonded strips has piezoelectric properties is known as a "unimorph". However, the more common form of piezoelectric flexure devices comprises a pair of piezoelectric strips, each being uniaxially polarized. Some such devices are known as Bimorph flexure devices, Bimorph being a trademark of Vernitron Corp. When an electric field is applied across the thickness dimension of each of the piezoelectric strips, such field being aligned with the poling direction of one of the strips and opposed to the poling direction of the other strip, one strip becomes longer while the other becomes shorter. The net result is that the structure bends or flexes, the action being somewhat akin to that of the heated bimetal strip. For a better description of the structural details of such devices and their various uses, one may refer to an article by C. P. Germano, entitled "Flexure Mode Piezoelectric Transducers," IEEE Transactions on Audio and Electroacoustics, Vol, AU-19, No. 1, March 1971.

In the paper "Electromechanical Device Using $PVF_2$ Multilayer Bimorph" by Toda and Osaka, Transactions of the IECE of Japan, Vol. E, 61, No. 7, July 1978, there is disclosed a piezoelectric flexure device in which the piezoelectric element(s) comprises several layers of a plastic film of polyvinylidene fluoride, commonly known as $PVF_2$. The multilayered structure is desirable from the standpoing that a relatively low voltage (e.g. 300 volts) can be used to drive a relatively thick (e.g. 1 mm) flexure device. Such a multilayered structure is achieved by sharply folding the $PVF_2$ film back upon itself, in a zig-zag fashion, to form a multitude of pleats. Prior to being folded, both sides of the $PVF_2$ film are provided with conductive coatings which function as electrodes by which an electric field can be applied across each layer of the $PVF_2$ film as produced by the folding operation. Also, an adhesive material is applied to the conductive coatings for the purpose of binding all of the folded layers together.

In manufacturing multilayered flexure devices of the type disclosed in the above-mentioned paper, some difficulty has been encountered in manipulating the $PVF_2$ film to produce the desired folded structure. Further, it has been observed that the conductive coatings on the $PVF_2$ film have a tendency to crack at each of the sharp folds in the $PVF_2$ film. This cracking, of course, disrupts the continuity of the electrode and prevents the applied voltage from producing an electric field across each of the $PVF_2$ layers. While some of these cracked electrodes can be readily repaired by applying a conductive paint to the exterior surface of the device, cracks which occur in the interior of the multilayered structure cannot be so easily repaired. As may be appreciated, these problems adversely affect manufacturing costs and yield.

SUMMARY OF THE INVENTION

In accordance with the present invention it has been found that multilayered piezoelectric elements of the type which are useful in piezoelectric flexure devices can be produced by winding a flexible piezoelectric film (e.g. a thin film of $PVF_2$) about an axis to produce a plurality of generally concentric piezoelectric layers. Preferably, both sides of the wound piezoelectric film are provided with conductive coatings which serve as electrodes by which an electric field can be applied to each of the layers of the wound structure. An adhesive overcoat is applied to the conductive coatings to bond the wound layers together. Preferably, the piezoelectric film is folded along a line intermediate its ends prior to the winding operation to prevent a short circuit between the conductive coatings of the multilayered structure. Alternatively, a dielectric adhesive is used as the adhesive overcoat to electrically isolate the conductive coatings on opposite sides of the piezoelectric layer.

The invention and its various advantages will be better understood from the ensuing detailed description of preferred embodiments, reference being made to the accompanying drawings.

DETAILED DESCRIPTION OF PREFERRED EMBODIMENTS

Figure 1:
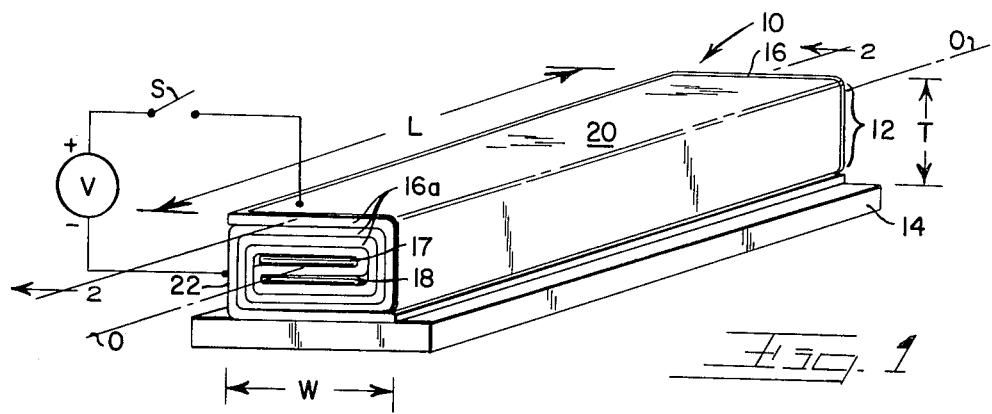
FIG. 1 is a perspective illustration of a unimorph flexure device structured in accordance with a preferred embodiment of the invention.
Figure 2:
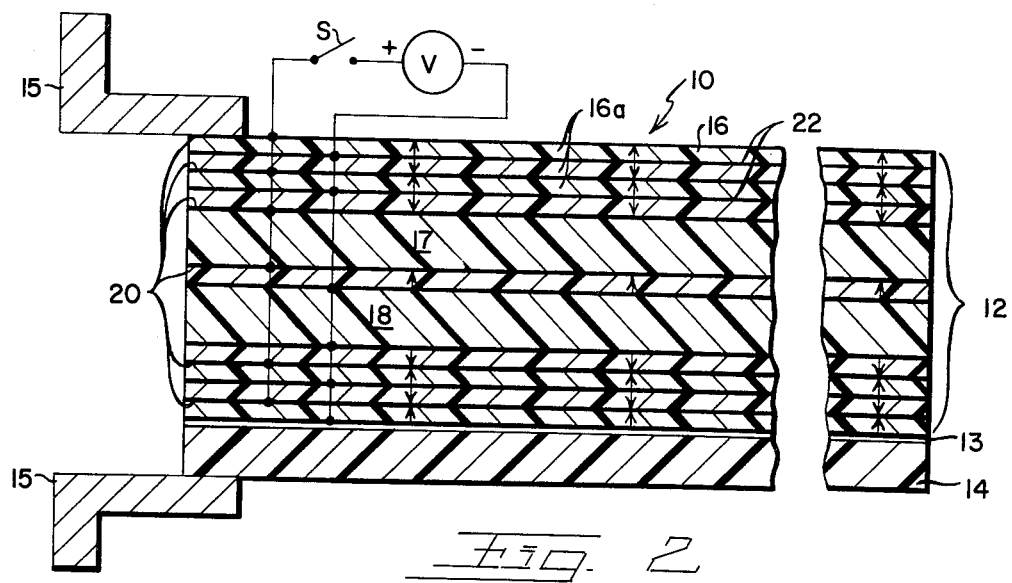
FIG. 2 is a cross-sectional illustration of the flexure device shown in FIG. 1 taken along the section line 2—2.

Referring now to the drawings, FIGS. 1 and 2 are perspective and cross-sectional illustrations, respectively, of a piezoelectric flexure device 10 structured in accordance with a preferred embodiment of the present invention. Flexure device 10 is of the aforementioned unimorph variety, basically comprising a multilayered piezoelectric element 12 which is bonded by an adhesive layer 13 (shown in FIG. 2) to an elongated member 14. In a unimorph device, member 14 does not exhibit piezoelectric properties and typically comprises a relatively stiff, yet bendable, light-weight plastic material; its function, as described below, is to resist dimensional changes of the piezoelectric element, as occasioned by subjecting such element to an electric field. In use, one end of the device 10 is usually engaged by a clamp 154 (shown in FIG. 2) to support the device in a cantilever fashion. When so supported, the free end of the device will move in response to an electric field of suitable field strength being applied to the piezoelectric element.

According to the present invention, piezoelectric element 12 comprises a relatively thin (e.g. $0.36 \times 10^{-3}$ inches) polymeric film 16, preferably polyvinylidene fluoride ($PVF_2$), which is wound about an axis 0 in a manner described below, to provide a plurality of polymeric layers 16a. Note, for the sake of illustration, only nine layers are shown; it is contemplated, however, that the piezoelectric element 12 will have many more layers, perhaps 50 or more, depending on the thickness of the film and the intended use of the device. Preferably, film 16 is wound about a pair of mandrels 17 and 18, made of light-weight material (e.g. polyurethane foam) which facilitates the winding operation without offering substantial resistance to dimensional changes of the multilayered structure (as described below). The front and rear surfaces of the polymeric film are coated with a conductive material, such as aluminum, to provide a pair of electrodes 20 and 22. These electrodes provide a means by which an electric field can be impressed across the entire film both before and after it has been wound. Preferably, the conductive coatings are slightly recessed from the edges of the film, as shown in FIG. 1, to minimize any chance of arcing when a high voltage source is connected therebetween. Upon winding film 16 as shown in FIG. 1, the electrodes 20 and 22 will be interconnected as shown in FIG. 2.

Figure 3:
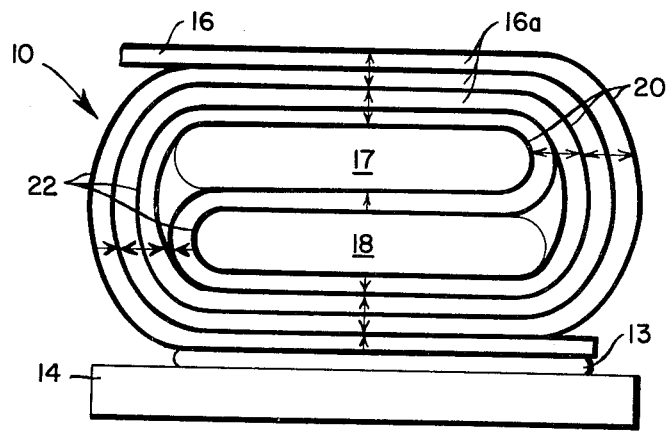
FIG. 3 is an enlarged end view of a piezoelectric unimorph structured in accordance with a preferred embodiment of the invention.

Film 16 is suitably poled, in the direction indicated by the arrows in FIGS. 2 and 3, to render it piezoelectric. The poling operation is well known and is preferably carried out before the polymeric film is wound; however, poling can be effected after the winding operation. Basically, the poling operation involves heating the film to an elevated temperature while applying an electric field across the thickness dimension of the film for some minimum time period. While processed in this manner, the electric dipoles in the film become aligned with the electric field lines. The dipoles remain aligned in this orientation after the electric field has been removed and the film has returned to ambient temperature. As regards $PVF_2$ film, the poling operation involves heating the material to approximately 100° C., and applying a field of approximately $1 \times 10^6$ volts/cm for a period of about 1 hour. For further details on the poling procedure for $PVF_2$, reference is made to the disclosures of U.S. Pat. No. 3,894,198 and British Pat. No. 1,349,860. Thin films of $PVF_2$ which are capable of being suitably poled to render them piezoelectric are commercially available from Kureha Chemical Industry, Co., Ltd., Tokyo, Japan.

As is well known, a piezoelectric element will undergo dimensional changes in the presence of an applied electric field. Thus, it may be appreciated that when a switch S is closed to apply a high voltage V between electrodes 20 and 22, thereby producing an electric field across the piezoelectric film 16, the length L of the piezoelectric element (as well as its width W and thickness T) will either expand or contract, depending on the direction of the applied electric field relative to the poling direction. It will be noted from FIG. 2 that the electric field applied to each layer is in the same direction with respect to the poling direction; thus, the entire multilayered piezoelectric structure will expand or contract in length, and this change in length will be resisted by the elongated member 14 to which the piezoelectric element 12 is bonded. The result will be a flexing or bending action of the flexure device.

In examining the enlarged end view of the unimorph device shown in FIG. 3, it will be appreciated that the sharp folds which characterize prior multilayered piezoelectric devices have been eliminated. In the wound piezoelectric device of the invention, each film winding has a relatively large radius of curvature to preserve the continuity of the electrode coatings. Note, while the film 16 sharply reverses direction after it is wound about mandrel 17, the sides of the mandrel are rounded to prevent the formation of a sharp crease which might tend to crack the conductive coatings. It should be noted, too, that the generally rectangular cross-section of the unimorph shown in FIGS. 1 and 3 is determined by the cross-sectional shape of the mandrels. The shape, of course, is only examplary of the shape which the wound piezoelectric element of the invention can assume. For example, the piezoelectric film could be wound about mandrels of triangular or circular cross-sectional shapes to produce similarly shaped cross sections.

Figure 5:
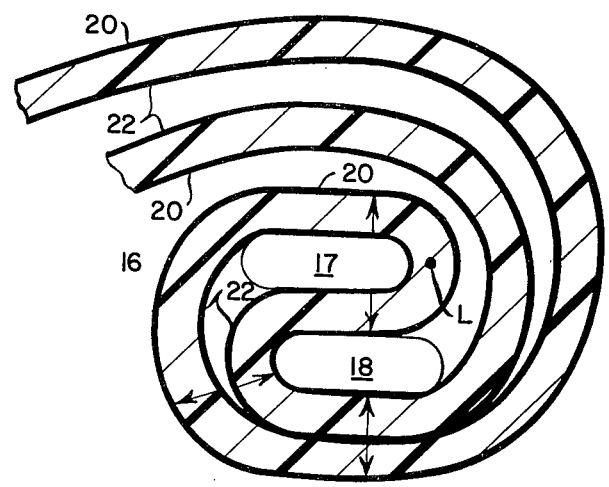
FIG. 5 illustrates a method for manufacturing a multilayered piezoelectric element of the type illustrated in FIGS. 1-4.

A preferred method for producing the wound piezoelectric element depicted in FIGS. 1 and 3 is illustrated in the cross-sectional illustration of FIG. 5. As shown, the piezoelectric film 16 is folded along a line L intermediate its ends and mandrel 17 is inserted inside the fold. Upon being folded in this manner, film 16 will form two parallel layers in which the direction of the polarization will be opposed, as indicated by the arrows. Upon positioning the second mandrel 18 juxtaposed mandrel 17 in the manner shown in FIG. 5, the two layers of piezoelectric film are successively wound about both mandrels in a counterclockwise direction until a desired number of layers 16a are provided. An adhesive layer (not shown) is applied to the conductive coatings prior to winding to bond the wound layers together. Preferably, this adhesive layer comprises Eastman 910 cement made by Eastman Kodak Company, Rochester, New York.

It will be noted that when film 16 is folded and wound in the manner shown in FIG. 5, electrodes 20 and 22 will not come in contact with each other; rather, each electrode will only come into contact with another portion of the same electrode. Also, it will be appreciated that rather than starting with a large sheet of piezoelectric material and folding it about mandrel 17 to produce two parallel layers in which the poling directions are opposed, two separate sheets of piezoelectric material, poled in opposite directions, could be wound about the mandrels. In other words, the piezoelectric film shown in FIG. 5 could be cut along the fold line L without altering the function of the piezoelectric element.

Figure 4:
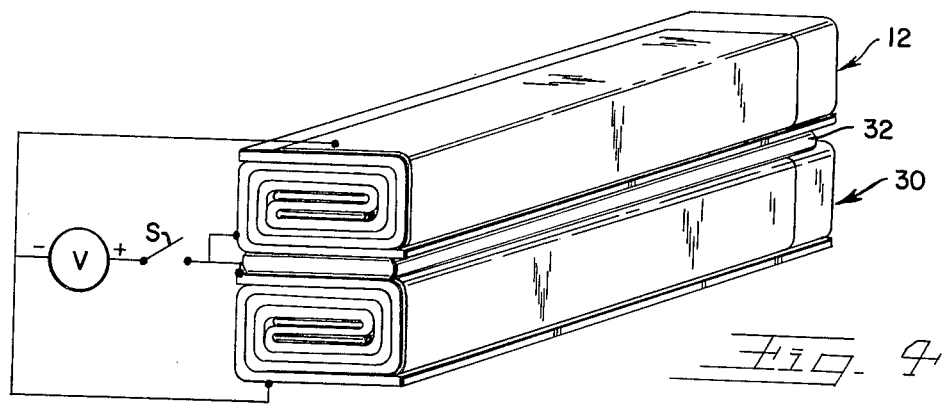
FIG. 4 is a perspective illustration of a piezoelectric flexure device of the Bimorph variety which is structured in accordance with a preferred embodiment of the invention.

In FIG. 4, the piezoelectric element of the invention is shown as embodied in a piezoelectric flexure device of the aforementioned Bimorph variety. Here, the elongated member 14 of the unimorph is replaced by a second piezoelectric element 30 which is structured similar to that of element 12. Piezoelectric elements 12 and 30 are bonded together by an adhesive layer 32 which preferably comprises a relatively stiff and light-weight plastic foam. As a high voltage source V is applied via switch S to the respective electrodes of each of the piezoelectric elements, thereby producing an electric field across the piezoelectric film of each of these elements, one element expands in length, while the other element contracts, thereby causing the device to flex or bend. To produce this result, the poling direction of element 30 is opposed to that of element 12 with respect to the applied electric field.

Figure 6:
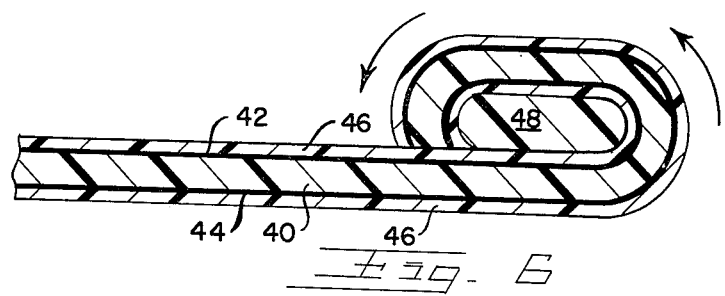
FIG. 6 illustrates a method for manufacturing an alternative form of a multilayered piezoelectric element.

As indicated above, the wound piezoelectric structure shown in FIGS. 1-5 is produced by winding a pair of piezoelectric layers (as produced by either folding one layer in half or providing two separate layers) about a common axis. The primary reason for starting with two layers is to avoid a shorting problem which results from winding a single layer which bears electrodes on both sides. One technique for obviating this shorting problem is shown in FIG. 6. As shown, a single piezoelectric layer 40 is provided with conductive coatings 42 and 44. An adhesive layer 46 selected for its insulating properties overlies both conductive coatings and acts to electrically isolate these coatings as the piezoelectric layer is wound about mandrel 48. A suitable insulating adhesive is Carboline F1 made by Carboline Company, St. Louis, Missouri.

The invention has been described in detail with particular reference to certain preferred embodiments thereof, but it will be understood that variations and modifications can be effected within the spirit and scope of the invention.

We claim:

1. In a piezoelectric flexure device comprising a piezoelectric element having means coupled thereto for causing the device to flex in response to subjecting the piezoelectric element to an electric field, the improvement wherein said piezoelectric element comprises a light-weight flexible, elongated mandrel having a generally rectangular cross section with rounded corners, a flexible piezoelectric film which is wound about said mandrel to form a plurality of generally concentric piezoelectric layers free from sharp bends or folds, and electrode means positioned between adjacent concentric layers for producing an electric field across each of said layers upon being connected to a voltage source.

2. The flexure device as defined by claim 1 wherein said mandrel comprises polyurethane foam.

3. The flexure device as defined by claim 2 wherein said flexible piezoelectric layer comprises polyvinylidene fluoride.

4. The flexure device as defined by claim 1 wherein said electrode means comprises conductive coatings, supported by opposing sides of said piezoelectric layer and said device further comprises means for electrically isolating the coatings borne by opposing sides of said piezoelectric layer.

5. The flexure device as defined by claim 1 further comprising an adhesive means supported by said electrode means for bonding said adjacent layers together.

6. The flexure device as defined by claim 1 wherein said means for causing said device to flex comprises a second piezoelectric element.

7. A piezoelectric flexure device comprising an elongated piezoelectric element having means coupled thereto for causing the device to flex in response to subjecting the piezoelectric element to an electric field, characterized in that said piezoelectric element comprises a light-weight, flexible, elongated mandrel having a generally rectangular cross section with rounded corners, and two flexible films of piezoelectric material, each of said films being unidirectionally polarized and having flexible electrodes disposed on opposing surfaces, said films being positioned juxtaposed so that their respective poling directions are opposed, and being wound together about said mandrel which is generally parallel to the longitudinal axis of the elongated piezoelectric element to form a plurality of generally concentric piezoelectric layers free from sharp bends or folds.

8. The flexure device as defined by claim 6 wherein said mandrel comprises polyurethane foam.

9. The flexure device as defined by claim 6 further comprising bonding means for bonding said concentric layers together.

10. A piezoelectric flexure device comprising (a) an elongated piezoelectric element which is adapted to experience dimensional changes when subjected to a changing electric field, and (b) means for resisting such changes to produce changes in shape of the flexure device, characterized in that said piezoelectric element comprises a first light-weight, flexible, elongated mandrel having a generally rectangular cross section with rounded corners, a flexible layers of piezoelectric material which has been polarized unidirectionally, said layer having electrically conductive layers disposed on opposing surfaces, and being folded along a line intermediate its ends over said first mandrel, and a second light-weight, flexible, elongated mandrel having a generally rectangular cross section with rounded corners, said folded layer being wound about said second mandrel generally parallel with said line to produce a plurality of generally concentric layers free from sharp bends or folds.

11. The flexure device as defined by claim 10 wherein said first and second mandrels comprise polyurethane foam.

12. The flexure device as defined by claim 10 further comprising bonding means for bonding said concentric layers together.

* * * * *